United States Patent
Åkesson et al.

(10) Patent No.: US 9,425,756 B2
(45) Date of Patent: Aug. 23, 2016

(54) AMPLIFIER DEVICE AND CORRESPONDING RADIO BASE STATION AND MOBILE COMMUNICATION TERMINAL

(75) Inventors: Daniel Åkesson, Hässelby (SE); Lars Ridell Virtanen, Gävle (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 14/412,136

(22) PCT Filed: Jul. 5, 2012

(86) PCT No.: PCT/SE2012/050788
§ 371 (c)(1),
(2), (4) Date: Dec. 30, 2014

(87) PCT Pub. No.: WO2014/007703
PCT Pub. Date: Jan. 9, 2014

(65) Prior Publication Data
US 2015/0188504 A1    Jul. 2, 2015

(51) Int. Cl.
*H03F 3/68* (2006.01)
*H03F 1/02* (2006.01)
*H03F 3/60* (2006.01)
*H03F 1/56* (2006.01)
*H04B 1/3827* (2015.01)
*H04B 1/40* (2015.01)

(52) U.S. Cl.
CPC ............... *H03F 3/68* (2013.01); *H03F 1/0288* (2013.01); *H03F 1/56* (2013.01); *H03F 3/602* (2013.01); *H04B 1/3833* (2013.01); *H04B 1/40* (2013.01); *H03F 2200/387* (2013.01); *H03F 2200/39* (2013.01); *H03F 2200/423* (2013.01)

(58) Field of Classification Search
CPC ....................................... H03F 3/60; H03F 3/68
USPC ....................................... 330/124 R, 286, 295
See application file for complete search history.

(56) References Cited

U.S. PATENT DOCUMENTS

2009/0295473 A1    12/2009    Dupuy et al.
2015/0229282 A1*    8/2015    Kaehs .................. H03F 1/0288
                                                               375/297

FOREIGN PATENT DOCUMENTS

CN    102142812 A    8/2011
WO    2004/088837 A2    10/2004

* cited by examiner

*Primary Examiner* — Steven J Mottola
(74) *Attorney, Agent, or Firm* — Patent Portfolio Builders, PLLC

(57) ABSTRACT

It is presented an amplifier device comprising: a primary amplifier arranged to receive at least part of an input signal; a secondary amplifier arranged to receive at least part of the input signal; a first directional coupler device, wherein one input of the first directional coupler device is connected to the primary amplifier and a second input of the first directional coupler device is connected to the secondary amplifier; and a first multiband termination device arranged to reflect signals with a predetermined reflection phase in at least two frequency bands. One output of the first directional coupler device is a main output of the amplifier device and a second output of the first directional coupler device is connected to the first multiband termination device. A corresponding radio base station and mobile communication terminal are also presented.

24 Claims, 6 Drawing Sheets

AMPLIFIER DEVICE AND CORRESPONDING RADIO BASE STATION AND MOBILE COMMUNICATION TERMINAL

CROSS REFERENCE TO RELATED APPLICATION(S)

This application is a 35 U.S.C. §371 National Phase Entry Application from PCT/SE2012/050788 Jul. 5, 2012, the disclosure of which is incorporated by reference.

TECHNICAL FIELD

The invention relates to amplifier devices and in particular amplifier devices with a main amplifier and a secondary amplifier.

BACKGROUND

Efficiency is an important figure of merit for a power amplifier (PA). Better efficiency increases battery life of a handset or reduces power consumption of radio base stations. With new communication standards such as Long Term Evolution (LTE) emerging, more and more frequency bands are allocated within the same regions or sites. Hence, interest in telecom equipment operating at multiple frequency bands is growing.

Moreover, digital modulation schemes for high data rates exhibit large amplitude dynamic range, with peak to average power ratios (PAPR's) in the order of 6 to 10 dB, meaning that the utilized amplifier should be operated at a reduced power; not only to be linear to faithfully transmit the modulation, but also in order to have enough power capability to handle those "rarely occurring" amplitude peaks within the amplitude envelope of the RF (Radio Frequency) signal.

Amplifiers typically exhibit their highest efficiency when operated in a saturated condition (i.e. with no available power headroom). If the PA "size" is dynamically adapted to the signal being amplified, this condition can be maintained over the amplitude dynamic range, thus improving efficiency for high PAPR signals. There exist a number of efficiency enhancement techniques to achieve such size adaption of the PA, such as dynamic drain modulation, where the DC supply voltage is varied, often referred to as envelope tracking (ET), and dynamic load modulation, where the terminating load impedance to the PA is varied with the signal envelope. Varying the load impedance for a fixed supply voltage changes the maximum available RF current swing, and thus the available power headroom, and hence maintains high efficiency over larger signal dynamic range.

However, both the drain modulator and the load modulator required in above concepts consume DC power, without contributing to any RF output power, thus impacting the total system efficiency.

Another, more common efficiency enhancement technique is therefore the Doherty principle, originally proposed by W. H. Doherty in 1936, where two separate amplifiers are combined without isolation, thereby affecting each other's load impedance. At higher power levels a peaking (or secondary) amplifier starts to work in parallel to a main (or primary) amplifier, thereby reducing the load impedance seen by the main amplifier, simultaneously contributing to output power in the higher power regimes.

The Doherty amplifier has been adjusted to support multiple frequency bands. For example, X. Li, W. Chen, Z. Zhang, Z. Feng, X. Tang, and K. Mouthaan, "A Concurrent Dual-Band Doherty Power Amplifier," Asia-Pacific Microw. Conf., Yokohama, Japan, December 2010, pp. 654-657 presents a novel Doherty power amplifier (PA) that realizes concurrent dualband operation. A T-network is used to implement a dual-band impedance transformer and a phase shifter simultaneously. To prove the concept a PA is designed operating at 900 MHz and 2000 MHz simultaneously. However, the presented solution necessitates dual-band modifications in at least four places of the output combining network in order to operate in the desired frequencies. This necessitates significant work to support any new or modified frequency.

SUMMARY

An object of embodiments presented herein is to provide more flexible and efficient way to achieve concurrent support for multiple frequency Doherty operation in power amplifiers.

A first aspect is an amplifier device comprising: a primary amplifier arranged to receive at least part of an input signal; a secondary amplifier arranged to receive at least part of the input signal; a first directional coupler device, wherein one input of the first directional coupler device is connected to the primary amplifier and a second input of the first directional coupler device is connected to the secondary amplifier; and a first multiband termination device arranged to reflect signals with a predetermined reflection phase in at least two frequency bands. One output of the first directional coupler device is a main output of the amplifier device and a second output of the first directional coupler device is connected to the first multiband termination device.

Using the arrangement of the first multiband termination device, amplification at multiple frequencies is achieved. Moreover, compared to the prior art, tuning to support a particular set of frequencies can be achieved by tuning only the first multiband termination device. In the prior art mentioned above by Li et al, each dual-band transformer must be designed both for impedance and electrical length requirements in both bands of operation, which increases the complexity and limits performance.

The amplifier device may further comprise a first splitter arranged to split the input signal, wherein one output of the first splitter is connected to the primary amplifier and one output of the first splitter is connected to the secondary amplifier.

The first splitter may be a directional coupler.

The secondary amplifier may be configured to be activated when the power of the input signal is greater than a first threshold value.

The first multiband termination device may comprise two serially connected transmission line sections of different impedances.

The first multiband termination device may comprise two serially connected transmission line sections and a third transmission line section connected on one end between the two serially connected transmission line sections.

The first multiband termination device may be arranged to reflect signals with a predetermined reflection phase in at least three frequency bands.

The first multiband termination device may comprise a fourth transmission line section connected on one end to an input of the first multiband termination device.

The first multiband termination device may comprise three serially connected transmission line sections of consecutively different impedances.

The first multiband termination device may comprise two serially connected transmission line sections of different impedances, wherein a first one of the serially connected transmission line sections is connected to an input of the first multiband termination device and a fourth transmission line section connected on one end to the input of the first multiband termination device.

The first multiband termination device may comprise at least two serially connected transmission line sections, and at least one resonator connected between a respective intermediate point and ground, each intermediate point being located between two consecutive transmission line sections.

The first multiband termination device may comprise at least two serially connected transmission line sections, and at least one resonator, connected serially between two consecutive transmission line sections.

At least one of the transmission line sections may be terminated in an open circuit.

At least one of the transmission line sections may be terminated in a short circuit.

The first multiband termination device may comprise distributed elements.

The first multiband termination device may comprise lumped elements.

The first directional coupler device may comprise at least two serially connected directional couplers.

The first directional coupler device may comprise at least three parallel connected directional couplers.

The amplifier device may further comprise a tertiary amplifier arranged to receive at least part of the input signal; a second directional coupler of which one input is connected to the output of the tertiary amplifier and a second input is connected to the output of the secondary amplifier; and a second multiband termination device arranged to reflect signals in at least two frequency bands. One output of the second directional coupler is then connected to the second multiband termination device and another output of the second directional coupler is then connected to one input of the first directional coupler.

The amplifier device may further comprise a second splitter arranged between the input signal and the first splitter, wherein the input signal is an input to the second splitter, one output of the second splitter is connected to the tertiary amplifier and another output of the second splitter is connected to an input of the first splitter.

The tertiary amplifier may be configured to be activated when the power of the input signal exceeds a second threshold value.

At least one of the amplifiers may be a wideband amplifier operable in a continuous frequency band covering the two frequency bands reflected with a predetermined reflection phase by the first multiband termination device.

At least one of the amplifiers may be a multiband amplifier operable in discrete frequency bands, the discrete frequency bands at least corresponding to the frequency bands reflected with a predetermined reflection phase by the first multiband termination device.

According to a second aspect, it is presented a radio base station comprising an amplifier device according to the first aspect.

According to a third aspect, it is presented a mobile communication terminal comprising an amplifier according to the first aspect.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
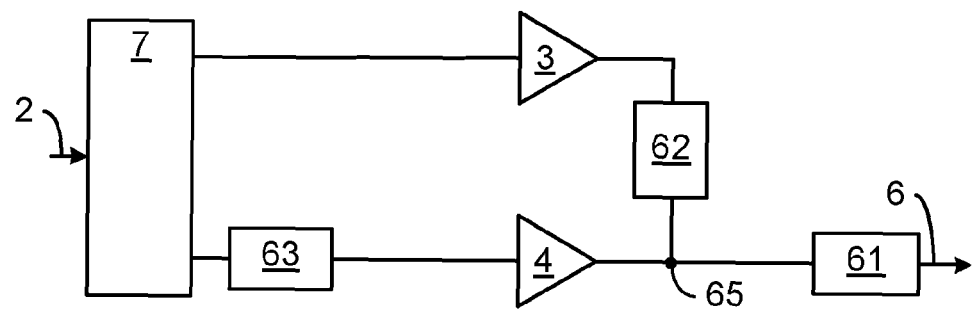
FIG. 1 is a schematic diagram illustrating the general principle of a Doherty amplifier.

FIG. 1 is a schematic diagram illustrating the general principle of a Doherty amplifier as presented in W. H. Doherty, "A New High Efficiency Power Amplifier for Modulated Waves," Proc. IRE, vol. 24, no. 9, pp. 1163-1182, 1936.

Here a primary amplifier 3 and a secondary amplifier 4 are combined without isolation, thereby affecting each others load impedance. The primary amplifier 3 is also known as a main or carrier amplifier and the secondary 4 amplifier is also known as a peaking or auxiliary amplifier.

At higher power levels, the secondary amplifier 4 starts to deliver output power in parallel to the primary amplifier 3, thereby reducing the load impedance seen by the primary amplifier, while simultaneously contributing to output power in the higher power regimes.

In the example of FIG. 1, the primary and secondary amplifiers 3, 4 are two equal amplifiers. Here we assume an optimum load impedance ($R_{opt}$) of 50Ω, implying that the highest saturated output power ($P_{sat}$) and efficiency is achieved when each amplifier is terminated into a 50Ω load.

An input splitter 7 divides an input signal 2 equally to both amplifiers. The splitter can be of many different types, such as a Wilkinson splitter, a branch line coupler or a multiple coupled lines Lange coupler for example. Here we assume it is being implemented as an ideal symmetric in-phase splitter, with phase coherent output signals.

On the output side, there is a first quarter wave transformer 61 provided between a combination point 65 and the output 6. The combination point is where the outputs from the two amplifiers 3, 4 are combined. Moreover, a second quarter wave transformer 62 is provided between the output of the primary amplifier 3 and the combination point 65. On the input side, there is a third quarter wave transformer 63. Each one of the quarter wave transformers provide a phase shift of 90° at the centre frequency of operation. In this example, the first quarter wave transformer 61 has an impedance of 35Ω and the second and the third quarter wave transformers 62, 63 each have an impedance of 50Ω.

A first mode of operation will now be explained, when the secondary (peaking) amplifier 4 is inactive. For low input power levels, the secondary amplifier 4 is inactive due to low biasing (typically using a class-C amplifier), thus not delivering any output power and also presenting a very high off-state output impedance at the combination point, minimizing the load modification and power leakage on the primary amplifier 3.

Seen from the output and working left to analyse impedances, the first quarter wave transformer 61 transforms the 50Ω load to a 25Ω common load ($Z_L$), as seen from the combination point 65. The second quarter wave transformer 62 then transforms the common load $Z_L$ to a 100Ω primary amplifier load.

When the primary amplifier 3 is terminated in a load of 2× $R_{opt}$, the maximum available RF current swing is halved for a fixed supply voltage, meaning that the primary amplifier 3 is saturated at only half of its full output power capability.

A second mode of operation will now be explained, when the secondary (peaking) amplifier 4 is active. When the input signal increase beyond $P_{sat}$ of the primary amplifier 3, the secondary amplifier 4 gradually turns on, injecting more and more current into the common load $Z_L$.

When both amplifiers inject the same RF current to $Z_L$, the load voltage seen from the primary amplifier 3 at the combination point 65 is doubled, which increases its effective impedance a factor of two, so that effectively, $Z_L$ equals $R_{opt}$.

Since the impedance of the second quarter wave transformer 62 is also $R_{opt}$, the same impedance is presented at the primary amplifier load, so that the primary amplifier 3 now operates at its full current swing, delivering full output power at optimum efficiency.

The load impedance seen by the primary amplifier 3 is indeed being pulled by the secondary amplifier 4 with a load-pull ratio of 2 (2× $R_{opt}$ reduced to 1× $R_{opt}$) and thus being modulated with the signal envelope. The secondary amplifier load impedance is also pulled (from a very high impedance in off-state) to $R_{opt}$, so both amplifiers are now saturated at their full output power capability.

In saturation, the second quarter wave transformer 62 only acts as a 90° phase shifter at the primary amplifier output. In order to ensure phase coherence at the combination point 65, the third quarter wave transformer 63 compensates for this phase shift on the input side to the secondary amplifier 3. In this way, the output from both amplifier branches are combined in-phase, contributing equally to total saturated output power.

The composite amplifier is saturated in both modes of operation: at $P_{sat}/2$ (secondary amplifier "off") and at $P_{sat} \times 2$ (both amplifiers saturated). Consequently peak efficiency is achieved at peak power, as well as at 6 dB back off, and thus maintaining high efficiency between the modes of operation.

By implementing larger secondary amplifier than primary amplifier, it is also possible to achieve the first efficiency peak at back off >6 dB, giving load-pull ratio >2 (asymmetric Doherty).

Figure 2:
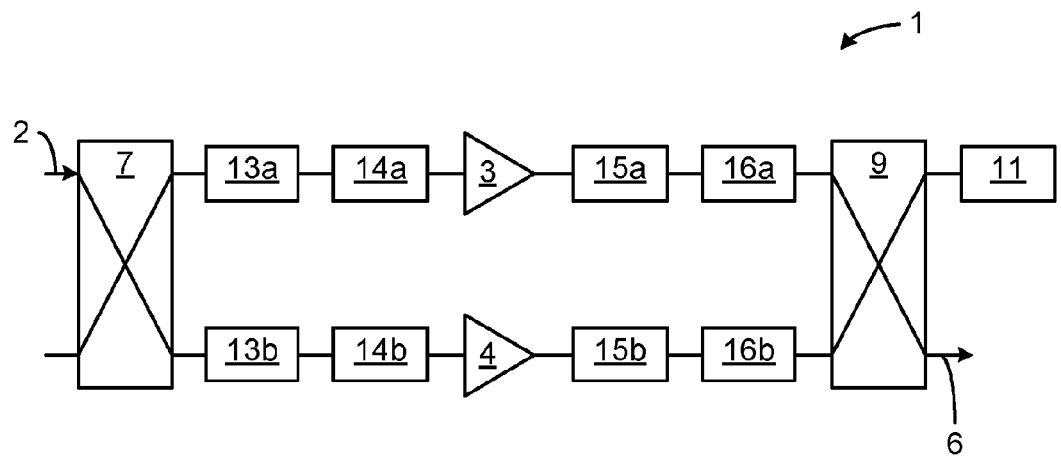
FIG. 2 is a schematic diagram illustrating an amplifier device according to one embodiment where the amplifier device is implemented as a Doherty amplifier device.

FIG. 2 is a schematic diagram illustrating an amplifier device 1 according to one embodiment where the amplifier device 1 is implemented as a Doherty amplifier device. This amplifier device 1 is an extension of the embodiment shown in FIG. 1 and shares the same principles for first and second modes of operation.

On the output side of this amplifier device 1, a first directional coupler device 9 is provided, from which the amplifier output 6 is obtained. The first directional coupler device 9 can e.g. be a hybrid coupler. The directional coupler device has the effect that when the other output port is terminated in an open circuit, it provides essentially the same amplifier loads in both modes of operation at a center frequency as the first and second quarter wave transformers 61, 62 of FIG. 1.

However, in this embodiment, the other output of the first directional coupler device 9 is connected to a first multiband termination device 11, which provides concurrent support for multi-frequency Doherty operation of the amplifier device 1 as explained in more detail below.

Between the amplifiers 3, 4 and the directional coupler 9 there is an output matching network comprising a first output matching network part 15a and a second output matching network part 15b. The output matching network may in fact (at least partly) form part of the amplifiers 3, 4 or connection lines on the output of the amplifiers 3, 4. If the impedance of the directional coupler device 9 does not equal $R_{opt}$, the output matching networks are required in order to match the amplifiers to the impedance of the directional coupler device 9. Any appropriate matching networks may be used. It is to be noted that the embodiments presented herein are not restricted to real impedance matching; a complex optimum impedance $Z_{opt}$ may also be matched with the output matching networks. Also, the matching networks 15a and 15b may not be identical and may also be used to match to different impedances.

The associated additional delays of the output matching networks 15a-b introduce phase shifts to the outputs, so that a purely real intrinsic load to the primary amplifier 3 and a very high real off-state impedance from the secondary amplifier 4 may not be achieved. Between the output matching network and the directional coupler device 9, there may be a first output offset device 16a and a second output offset device 16b respectively provided, connected to the primary and secondary amplifiers 3, 4. The offset devices can e.g. be implemented using offset lines. If the first multiband termination device 11 is configured so as to provide an open circuit at a first single frequency f1, the first and second offset devices 16a and 16b may compensate such that the electric length from the respective intrinsic transistors of the amplifiers, to the inputs of the directional coupler device 9 is n×180° at f1, where n is an arbitrary positive integer. This way impedance conditions for optimum Doherty operation is obtained at f1. Consequently, at another single frequency f2, the offset devices need to be correspondingly adjusted to still meet the n×180° condition.

However, adding electrical phase offset to the assumed open circuit presented by the first multiband termination device 11, is equivalent to adding the same phase offset to both inputs of the directional coupler. If the first multiband termination device 11 is configured to provide an open circuit termination at a first frequency f1, and the corresponding required phase offset to the open circuit at a second frequency f2, concurrent Doherty operation at f1 and f2 is achieved.

It is to be noted that the offset devices 16a-b work in concert with the first multiband termination device 11. For example, a first embodiment with both offset devices 16a-b being implemented as 180° offset lines at a first frequency, is equivalent to a second embodiment with zero degree offset devices 16a-b and the multiband termination device 11 having a 180° phase offset at the same frequency. Hence, the multiband termination device can be used in combination with the offset devices 16a-b to tune the electrical length after the amplifiers 3, 4 at multiple frequencies.

On the input side, and optional input splitter 7 is fed the input signal 2. The input splitter 7 provides the input signal to both amplifiers 3, 4. The splitter 7 can be of many different types, such as a directional coupler, a hybrid coupler, a branch line coupler or a multiple coupled lines Lange coupler. Alternatively, the input signal 2 is provided in parallel to both amplifiers 3, 4 and no splitter is provided as part of the amplifier device 1. In this embodiment the splitter 7 is a directional coupler of the same type as the first directional coupler 9, which has the advantage that the phase difference between the primary and secondary amplifiers 3, 4 in the first directional coupler 9 is compensated on the input side over a wide frequency band. The isolated port 8 of the input splitter is however conventionally terminated in a 50Ω load, to provide input isolation.

The signal from the input splitter 7 for the primary amplifier 3 and secondary amplifier 4 optionally first reaches a first input offset device 13a and a second input offset device 13b. The input offset devices 13a, 13b can e.g. be implemented using offset lines. The offset devices compensate for the phase difference between the primary and the secondary amplifiers 3, 4 on the output side, so that the output from both amplifier branches are combined in phase, contributing to total saturated output power. Just before the amplifiers 3, 4, there is an input matching network comprising a first input matching network part 14a and a second input matching network part 14b. The input matching network provides an input impedance which matches the impedance of the amplifiers through appropriate transformation. This typically maximises gain and minimises reflections.

The primary amplifier 3 and the secondary amplifier 4 can e.g. be implemented using a variety of transistor types or technologies such as FETs (Field Effect Transistors), MOSFETs (Metal-Oxide-Semiconductor FETs), BJTs (Bipolar Junction Transistors), LDMOSs (Laterally Diffused Metal Oxide Semiconductors) or HEMTs (High Electron Mobility Transistors).

As shown below in FIGS. 5A-C, the first directional coupler device 9 can be implemented in a variety of embodiments.

As mentioned, the amplifier device in this embodiment is an expansion of the Doherty amplifier of FIG. 1 and thus also works in two modes—the first mode of operation where the secondary amplifier 4 is inactive and the second mode of operation where the secondary amplifier is active.

In the first mode of operation, the secondary amplifier 4 is thus inactive. This can e.g. be implemented by low biasing (typically using a class-C amplifier), thus not delivering any output power and also presenting a very high off-state output impedance at the combiner input, minimizing the load modification and power leakage on the primary amplifier 3. Just like for the embodiment of FIG. 1, the second mode of operation occurs when the input signal increases beyond a first threshold value corresponding to the vicinity of saturation ($P_{sat}$) of the primary amplifier.

The first multiband termination device 11 is a fixed, passive reflective network, configured so as to provide predetermined reflection phases at desired frequencies of operation. In this way, conditions for Doherty operation can be concurrently fulfilled at the desired frequencies. In other words, the amplifier device 1 is operable at multiple frequencies without any need of further tuning or reconfiguration. As will be shown below, the first multiband termination device can be configured for two, three, four or more frequency bands. Using the first multiband termination device 11, along with a wideband or multiband directional coupler device 9, the offset devices 16a-b do not need to be frequency tuned which dramatically simplifies the structure for the multiband amplifier device 1 compared to the prior art.

Since the first multiband termination device 11 is provided on the output side, connected to the first directional coupler device, it is easily reconfigured for various frequency bands, compared to multiband solutions for Doherty amplifiers known in the art.

For example, frequency bands used in mobile communication systems vary from region to region. In the solution presented herein, the desired frequency characteristics can be achieved by choosing an appropriate structure and tuning of elements of the first multiband termination device 11. In other words, as long as the amplifiers 3, 4, the directional coupler 9 and the input splitter 7 (when present) support the desired frequency bands, only the first multiband termination device 11 needs to be reconfigured for a different set of frequency bands; the rest of the amplifier device 1 does not need to be reconfigured.

Furthermore, from a loss perspective it is an advantage to implement as much as possible of the phase compensation into the multiband termination device 11 and thus minimize the length and the associated loss of the output offset devices 16a-b which is now explained.

In the first mode of operation (where the secondary amplifier is inactive), only part of the output signal is coupled and reflected in the lossy multiband termination device 11. This reduces output loss of the primary amplifier 3, as compared to implementing phase offset in the output offset device 16a. Also, as a consequence of reduced loss in the output offset device 16b, the power leakage into the secondary (peaking) branch is reduced, due to less degraded off-state impedance of the secondary amplifier 4.

In saturation of the second mode of operation (where the secondary amplifier 4 is also saturated), the corresponding output signals are equal in amplitude, but arrive in opposite phase at the termination port so that they cancel out, whereby no loss at all is added from the multiband termination device 11. Also, there are no specific impedance criteria on the multiband termination device, whereby lower impedance lines with reduced loss may be used.

The amplifiers can be configured in different ways to cover the frequency bands where reflection occurs with predetermined reflection phase by the first multiband termination device 11.

In one embodiment, at least one of the amplifiers 3, 4 is a wideband amplifier operable in a continuous frequency band covering at least the two frequency bands where reflection occurs with predetermined reflection phase by the first multiband termination device 11.

In one embodiment at least one of the amplifiers 3, 4 is a multiband amplifier operable in discrete frequency bands, the discrete frequency bands at least corresponding to the frequency bands where reflection occurs with predetermined reflection phase by the first multiband termination device 11.

In one embodiment, the characteristic impedance of the first directional coupler 9 may have an intermediate impedance between $R_{opt}$ and the output impedance of the amplifier.

This allows at least part of the output matching network to be placed on the output side of the coupler. This can reduce impact on bandwidth, by reducing electrical delay of the output matching, prior to the combining.

Figure 3:
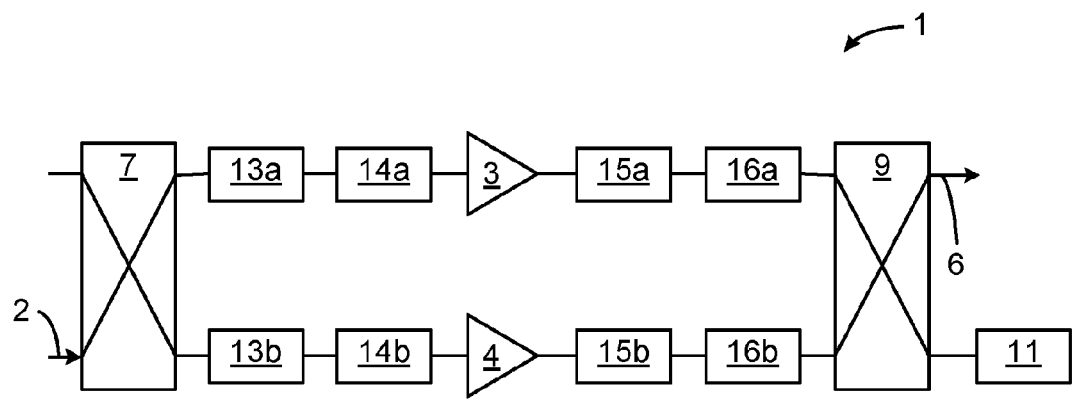
FIG. 3 is a schematic diagram illustrating an amplifier device according to an alternative embodiment where the amplifier device is implemented as a Doherty amplifier device.

FIG. 3 is a schematic diagram illustrating an amplifier device according to an alternative embodiment where the amplifier device is also implemented as a Doherty amplifier device. The main structural difference compared to the Doherty amplifier device of FIG. 1, is that the outputs of the first directional coupler device 9 are swapped. A corresponding swap of inputs to the input splitter 7 (if present), to achieve in-phase combining is beneficial in this case, or the input offset devices 13a-b can be configured appropriately.

In the amplifier device of FIG. 3, the input impedance to the first amplifier 3 from the directional coupler device 9 increases with increased output signal from the secondary amplifier 4. This is in contrast to the amplifier device of FIG. 2, where the input impedance to the first amplifier 3 decreases with increased output signal. Hence, such a configuration has an inverted $Z_L$ versus output power characteristic, compared to the conventional Doherty amplifier of FIG. 1 and FIG. 2. A correspondingly adjusted first multiband termination device 11 in concert with adjusted output offset devices 16a-b is however equally usable in this embodiment.

It is also to be noted that the multiband termination device 11 is equally applicable in asymmetric Doherty amplifiers, if the coupling of the directional coupler is properly adjusted. Asymmetric Doherty amplifiers are known in the art and will not be explained in detail here.

FIGS. 4A-G are schematic diagrams illustrating various embodiments of a multiband termination device 11 for connection to a directional coupler device on the output side of a multi-band Doherty amplifier device. For example, the multiband termination device can be the multiband termination device of FIGS. 2-3 or each one of the first and second multiband termination devices 11a-b of FIG. 6. Each embodiment has an input side 35 arranged to be connected e.g. to the first directional coupler device of FIGS. 2-3 and 6.

Figure 4A:
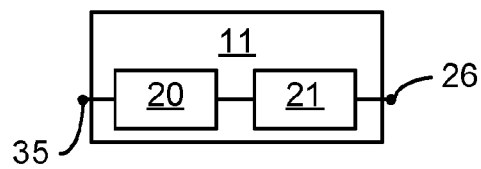
FIGS. 4A-G are schematic diagrams illustrating various embodiments of the multiband termination device of FIGS. 2-3, 6.

In FIG. 4A, an embodiment of the multiband termination device 11 is illustrated with a first termination side 26. The multiband termination device 11 comprises two serially connected transmission line sections 20, 21 of different impedances. In this way, the multiband termination device 11 can be arranged to reflect signals with predetermined reflection phase in two frequency bands. The two transmission line sections 20, 21 are dimensioned to achieve predetermined phase reflection at desired frequency bands for the application of the amplifier device comprising the multiband termination device 11.

The multiband termination device 11 is terminated in the first termination side 26 in either an open circuit or short circuit, giving different characteristics of reflection to thereby give more freedom in design to achieve desired frequency and/or bandwidth characteristics, as well as providing more layout flexibility.

Figure 4B:
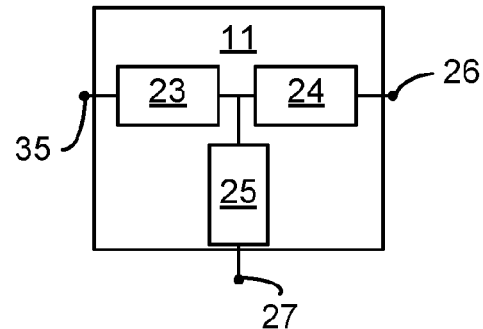

In FIG. 4B, an alternative embodiment of the multiband termination device 11 for two bands is illustrated with a first termination side 26 and a second termination side 27. The multiband termination device 11 is here implemented as a T-stub, comprising two serially connected transmission line sections 23, 24 and a third transmission line section 25 connected on one end between the two serially connected transmission line sections. The second termination side 27 is on the side of the third transmission line section 25 which is not connected to the other two line sections 23, 24.

Again, the multiband termination device 11 can be terminated in either an open circuit or short circuit, giving different characteristics of reflection to thereby give more freedom in design to achieve desired frequency and/or bandwidth characteristics, as well as providing more layout flexibility. The first termination side 26 and the second termination side 27 can be terminated both in open circuits, both in short circuits or either one in a short circuit and the other in an open circuit.

Figure 4C:
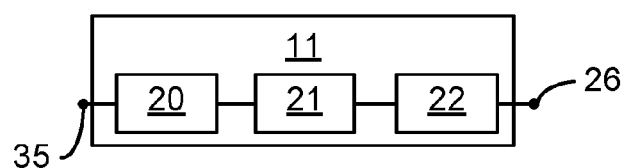

In FIG. 4C, an embodiment of the multiband termination device 11 is illustrated, as an expansion of the embodiment shown in FIG. 4A in order to control three frequency bands, with a first termination side 26. The multiband termination device 11 comprises three serially connected transmission line sections 20, 21, 22 of consecutively different impedances. In other words, the first and second line sections 20, 21 have different impedances and the second and third line sections 21, 22 have different impedances. The first and third line sections 20, 22 can have different or the same impedances. In this way, the multiband termination device 11 can be arranged to reflect signals with predetermined reflection phase in three frequency bands. The three transmission line sections 20, 21, 22 are dimensioned to achieve reflection with predetermined reflection phase at desired frequency bands for the application of the amplifier device comprising the multiband termination device 11.

As with the embodiment shown in FIG. 4A, the multiband termination device 11 is terminated in the first termination side 26 in either an open circuit or short circuit, giving different characteristics of reflection to thereby give more freedom in design to achieve desired frequency and/or bandwidth characteristics, as well as providing more layout flexibility.

Figure 4D:
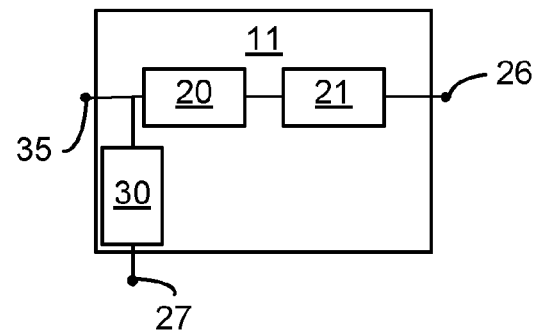

In FIG. 4D, an embodiment of the multiband termination device 11 is illustrated, as an alternative expansion of the embodiment shown in FIG. 4A in order to control three frequency bands. Here, there is a first termination side 26 and a second termination side 27 like the embodiment of FIG. 4B. The multiband termination device 11 comprises two serially connected transmission line sections 20, 21 of different impedances. The first one 20 of the serially connected transmission line sections is connected to the input 35 of the multiband termination device 11. A fourth transmission line section 30 is connected on one end to the input 35 of the multiband termination device and the other end is the second termination side 27.

Again, the multiband termination device 11 can be terminated in either an open circuit or short circuit, giving different characteristics of reflection to thereby give more freedom in design to achieve desired frequency and/or bandwidth characteristics, as well as providing more layout flexibility. The first termination side 26 and the second termination side 27 can be terminated both in open circuits, both in short circuits or either one in a short circuit and the other in an open circuit.

Figure 4E:
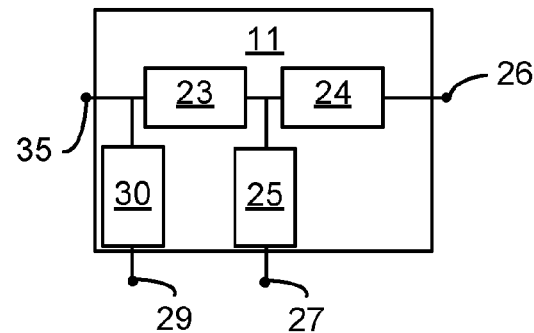

In FIG. 4E, an embodiment of the multiband termination device 11 is illustrated, as an expansion of the embodiment in FIG. 4B in order to control three frequency bands. The multiband termination device 11 is here implemented as a T-stub, comprising two serially connected transmission line sections 23, 24 and a third transmission line section 25 connected on one end between the two serially connected transmission line sections. The second termination side 27 is on the side of the third transmission line section 25 which is not connected to the other two line sections 23, 24. A fourth transmission line section 30 is connected on one end to the input 35 of the multiband termination device and the other end is a third termination side 29. In this way, reflection with predetermined reflection phase in three frequency bands can be achieved. Again, each of the termination sides 26, 27, 29 can individually be configured to be terminated in open circuits or short circuits.

Figure 4F:
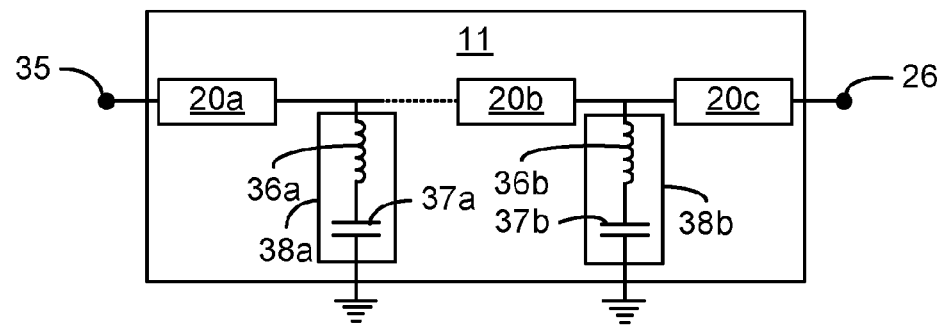

In FIG. 4F, an embodiment of the multiband termination device 11 is illustrated as a composite transmission line. The termination side 26 can be configured to be terminated in an open circuit or a short circuit. The composite transmission line comprises two or more serially connected transmission line sections 20a-c, each section separated by a frequency selective resonator 38a-b, tuned to one specific desired operational band of the Doherty amplifier. Each resonator 38a-b comprises a respective inductor 36a-b and capacitor 37a-b, serially connected from the transmission line to ground.

At a resonance frequency of any one of the resonators 38a-b, the multiband termination device 11 is effectively terminated with a high reflection coefficient (i.e. a short circuit from the resonator), so that the remaining sections on the termination side of the composite transmission line (to the right of the corresponding resonator 38a-b in the figure) do not affect reflection phase. At the same frequency, all other resonators tuned to other operational bands are out off resonance, and thus do not affect reflection phase.

In this way, a multiband termination device 11 is achieved with frequency selective effective length, and corresponding reflection phase for each operational band. Predetermined reflection phase at multiple frequencies can thus be achieved.

This embodiment is similar to the embodiments of FIGS. 4B and 4E, since there the transmission line sections 23 and 24 are separated by transmission line sections 25 and 30, which, close to resonance, can be represented with shunt connected series resonators.

Figure 4G:
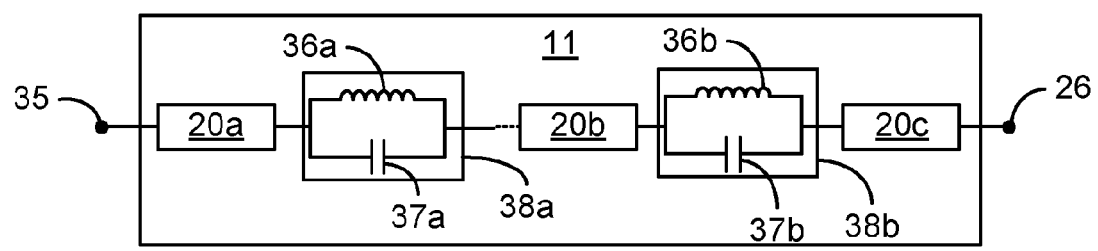

In FIG. 4G, another embodiment of the multiband termination device 11 is illustrated as a composite transmission line. The termination side 26 can be configured to be terminated in an open circuit or a short circuit. The composite transmission line comprises two or more serially connected transmission line sections 20a-c, each section separated by a frequency selective resonator 38a-b, tuned to one specific desired operational band of the Doherty amplifier. Here each resonator 38a-b is serially connected between two transmission line sections. In this embodiment, each resonator 38a-b comprises a respective inductor 36a-b and capacitor 37a, connected in parallel.

The embodiment operates in a similar way to the embodiment of FIG. 4F, where the resonance frequencies of the resonators 38a-b are used to achieve predetermined reflection phase in at least two frequency bands, using a slightly different configuration of the resonators. At a resonance frequency of any one of the resonators 38a-b, the multiband termination device 11 is effectively terminated with an open circuit from the resonator in this embodiment.

For the embodiments of the multiband termination device 11 of FIGS. 4A-E, all the transmission line sections are implemented using distributed elements. Alternatively, part of or all of the transmission line sections and resonators are implemented using lumped elements, as exemplified in the multiband termination devices 11 of FIGS. 4F, G.

Figure 5A:
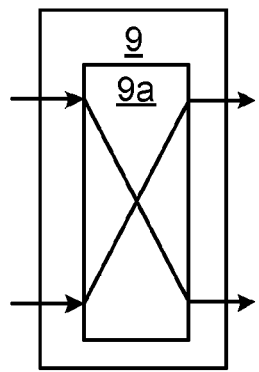
FIGS. 5A-C are schematic diagrams illustrating various embodiments of the directional coupler device of FIGS. 2-3, 6.
Figure 5B:
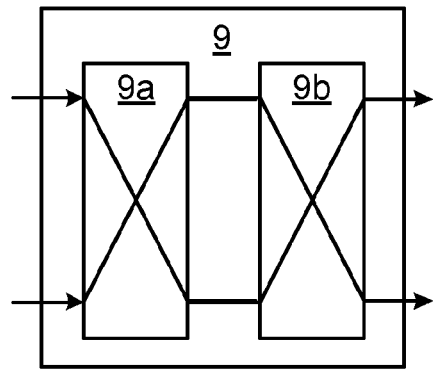
Figure 5C:
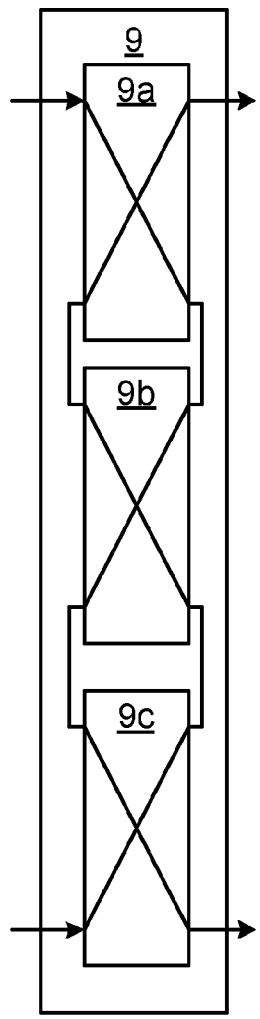
Figure 6:
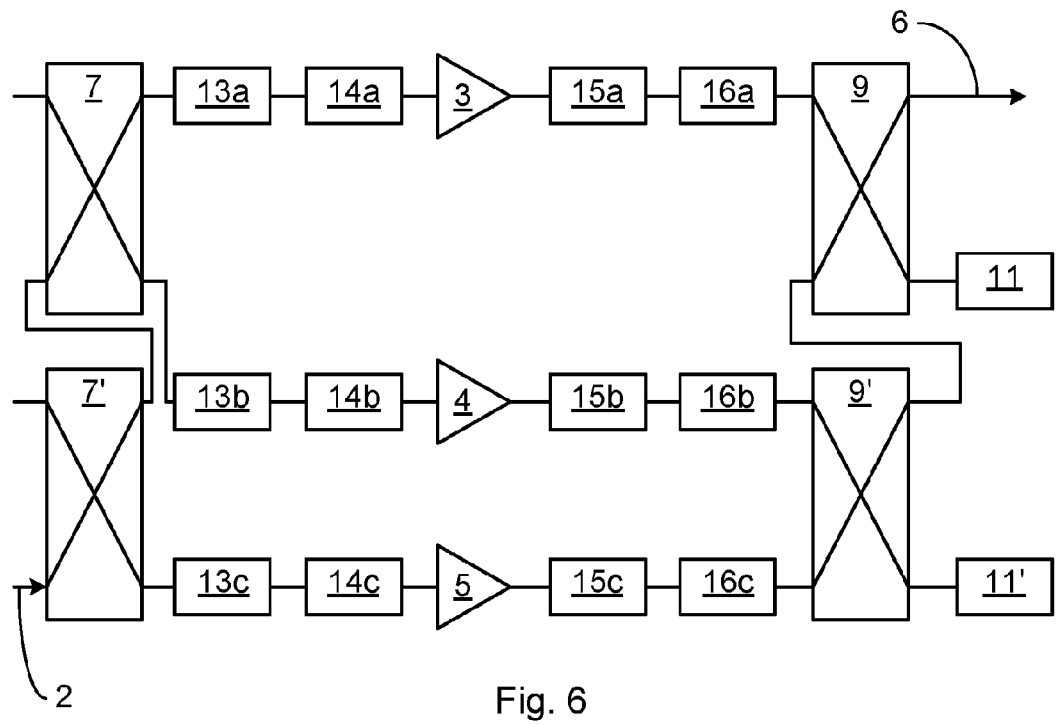
FIG. 6 is a schematic diagram illustrating an amplifier device according to one embodiment where the amplifier device is implemented as a three way Doherty amplifier device.

FIGS. 5A-C are schematic diagrams illustrating various embodiments of the directional coupler device 9 of FIGS. 2-3, 6. The directional coupler device 9 can be the first directional coupler device 9 of FIGS. 2-3 or the first or second directional coupler device 9, 9' of FIG. 6. Moreover, the input splitter 7 of FIGS. 2-3 or the first or second input splitter 7,7' of FIG. 6 could be implemented in the same way, when implemented as a directional coupler.

In FIG. 5A, the directional coupler device 9 comprises a single directional coupler 9a. Different coupling factors could be used to implement variants of asymmetric Doherty amplifiers, as already mentioned.

In FIG. 5B, the directional coupler device 9 comprises at least two serially connected directional couplers 9a-b. Such an arrangement can be used to achieve a higher coupling factor, which can be useful if required coupling factor is hard to achieve in a certain technology. For example two −8.34 dB couplers may be serially connected to realize a 3 dB coupler.

In FIG. 5C, the directional coupler device 9 comprises at least three directional couplers 9a-c connected in parallel. Such an arrangement can achieve a greater bandwidth than a single directional coupler device. For example, if the first and third directional couplers 9a, c are chosen to −16.5 dB and the second directional coupler 9b is −1.7 dB, a wideband −3 dB coupler device is achieved with ~96% relative equal amplitude ripple bandwidth, covering for example 700-2000 MHz.

Here, a first input of the directional coupler device 9 is provided to a first input of the first directional coupler 9a, and a second input of the directional coupler device 9 is provided to a second input of the third directional coupler 9c. The second input of the first directional coupler 9a is connected to a first input of the second directional coupler 9b. Moreover, the first input of the third directional coupler 9c is coupled to the second input of the second directional coupler 9b.

An equivalent structure is provided on the output side, whereby a first output of the directional coupler device 9 is connected to a first output of the first directional coupler 9a, and a second output of the directional coupler device 9 is connected to a second output of the third directional coupler 9c. The second output of the first directional coupler 9a is connected to a first output of the second directional coupler 9b. Moreover, the first output of the third directional coupler 9c is coupled to the second output of the second directional coupler 9b.

The embodiment structure shown in FIG. 5C can be expanded to any odd number of directional couplers, e.g. five, seven, etc. directional couplers to further extend bandwidth.

FIG. 6 is a schematic diagram illustrating an amplifier device according to one embodiment where the amplifier device is implemented as a three way Doherty amplifier device. In addition to what is shown in FIG. 3, a tertiary amplifier 5 is provided to receive at least part of the input signal. In order to make use of the tertiary amplifier 5, a second directional coupler 9' is also provided, of which one input is connected to the output of the tertiary amplifier 5 and a second input is connected to the output of the secondary amplifier 4.

Also, a second multiband termination device 11' is of the same configuration as the first multiband termination device 11 in the way that it is arranged to reflect signals with predetermined reflection phase in at least two frequency bands. One output of the second directional coupler 9' is connected to the second multiband termination device 11' and another output of the second directional coupler 9' is connected to one input of the first directional coupler 9. In this way, all amplifiers contribute to the output 6.

The tertiary amplifier 5 is connected to a third input offset device 13c, a third input matching network part 14c, a third output matching network part 15c, and a third output offset device 16c of equivalent structure, but potentially different values, compared to those connected to the primary amplifier 3 and the secondary amplifier 4.

The tertiary amplifier 5 is configured to be activated when the power of the input signal exceeds a second threshold value.

One way to provide the input signal to the tertiary amplifier 5 is to use a second splitter 7'. The second splitter 7' is then arranged in cascade with the first splitter 7, such that one output of the second splitter 7' is connected to the tertiary amplifier 5 and another output of the second splitter 7' is connected to an input of the first splitter 7. The input to the amplifier device 1 is in this embodiment provided as one input to the second splitter 7'.

Optionally, the first splitter 7 is omitted and only the second splitter 7' is provided. The input signal to the primary amplifier is then provided in parallel to the input signal to the second splitter 7'.

The solutions presented herein can also be extended to Doherty amplifiers of higher orders, including four-way amplifier devices, five-way amplifier devices, etc.

Figure 7:
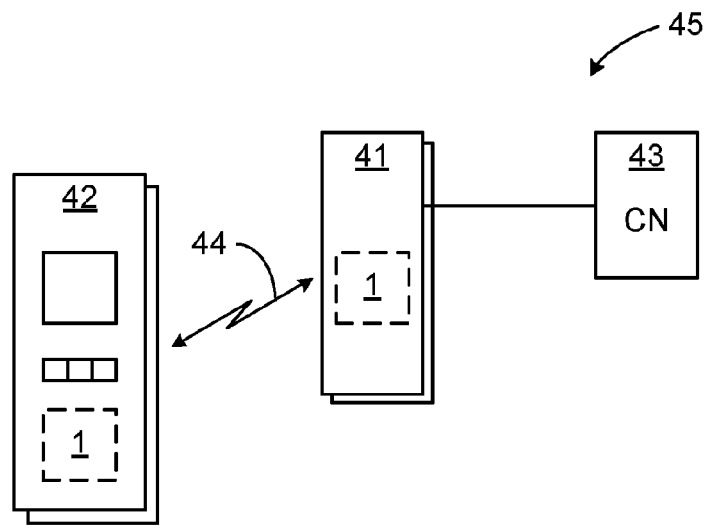
FIG. 7 is a schematic diagram illustrating a mobile communication network 45 where embodiments presented herein can be applied.

FIG. 7 is a schematic diagram illustrating a mobile communication network 45 where embodiments presented herein can be applied. The mobile communications network 45 comprises a core network 43 and one or more radio base stations 41, in the form of Node Bs 41, evolved Node Bs, BTSs (Base Transceiver Stations) and/or BSSs (Base Station Subsystems). The radio base station 41 provides radio connectivity to a plurality of mobile communication terminals 42. The term mobile communication terminal is also known as user equipment, mobile terminal, user terminal, user agent, etc.

The mobile communication network 45 can e.g. comply with any one or a combination of W-CDMA (Wideband Code Division Multiplex), LTE, EDGE (Enhanced Data Rates for GSM (Global System for Mobile communications) Evolution, GPRS (General Packet Radio Service)), CDMA2000 (Code Division Multiple Access 2000), etc.

The communication between each one of the mobile communication terminals 42 and the radio base stations 41 occurs over a wireless radio interface 44.

Here, the radio base stations 41 each comprise at least one amplifier device 1 according to what is described above with reference to FIGS. 2-3, 6 for power amplification prior to transmission over the wireless radio interface 44. Moreover, one or more of the mobile communication terminals 42 comprises at least one amplifier device according to what is described above with reference to FIGS. 2-3, 6 power amplification prior to transmission over the wireless radio interface 44.

Using the multiband termination device described above, a number of advantages are achieved compared to the multiband solutions known in the art.

Firstly, the solution reduces complexity. Provided that the primary amplifier, the secondary amplifier and the directional coupler device and the splitter (if present) all support the desired frequency ranges, Doherty functionality within multiple bands only needs to be considered in the first mode where the secondary amplifier is off, with the only criteria being reflection phase of the multiband termination device. Therefore it is more simple to redesign an amplifier device for other frequencies than in prior art.

Secondly, improved design flexibility is achieved. There are no specific requirements on characteristic impedance of the multiband termination device, whereby there are many possible topologies that can be used, such as the ones illustrated in FIGS. 4A-G. The flexibility of redistribution of phase offset between offset line side and termination side of the directional coupler device makes it more convenient to fit in a layout. Trimming is more convenient when applied to a multiband termination device stub, compared to modifying dual-band offset lines as is necessary in the prior art. This also makes it possible to reconfigure to specific bands, by switching parts or all of the termination network, for example by mounting different components or passive integrated modules, applicable for fixed product configurations, or by tuning, for factory or field reconfigurable products.

Thirdly, losses are low. As explained above, the multiband termination device is isolated when both amplifiers are saturated in the second operational mode. Furthermore, no extra, lossy lines, except the multiband termination device are required, compared to dualband transformers and offset lines of the prior art. When lossy offset lines are transferred to the multiband termination device with the same loss at the termination side, output loss is effectively reduced. Since the multiband termination device is physically located on one end, or even outside, the actual amplifier, it can more conveniently be implemented in any suitable low loss technology, such as suspended lines or low-loss modules.

Fourthly, space requirements are reduced. Extra board space is only required for the multiband termination device, compared to dual-band transformers and offset lines in prior art which are required not in just one, but multiple locations.

Fifthly, a wide range of frequency ratios can be supported. Due to the reduced complexity, the individual bands can be placed in a wide range of frequency ratios, without significant effect on performance.

Sixthly, great compatibility is achieved. As explained above, the multiband termination device is compatible with asymmetrical Doherty amplifiers. It may also be extended to N-way Doherty amplifiers, with multiple peaking (secondary, tertiary, etc.) amplifiers.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. An amplifier device comprising:
   a primary amplifier arranged to receive at least part of an input signal;
   a secondary amplifier arranged to receive at least part of the input signal;
   a first directional coupler device, wherein one input of the first directional coupler device is connected to the primary amplifier and a second input of the first directional coupler device is connected to the secondary amplifier, wherein the first directional coupler device comprises at least two serially connected directional couplers; and
   a first multiband termination device arranged to reflect signals with a predetermined reflection phase in at least two frequency bands;
   wherein one output of the first directional coupler device is a main output of the amplifier device and a second output of the first directional coupler device is connected to the first multiband termination device.

2. The amplifier device according to claim 1, further comprising a first splitter arranged to split the input signal, wherein one output of the first splitter is connected to the primary amplifier and another output of the first splitter is connected to the secondary amplifier.

3. The amplifier device according to claim 2, wherein the first splitter is a directional coupler.

4. The amplifier device according to claim 1, wherein the secondary amplifier is configured to be activated when the power of the input signal is greater than a first threshold value.

5. The amplifier device according to claim 1, wherein the first multiband termination device comprises two serially connected transmission line sections of different impedances.

6. The amplifier device according to claim 1, wherein the first multiband termination device comprises two serially connected transmission line sections and a third transmission line section connected on one end between the two serially connected transmission line sections.

7. The amplifier device according to claim k wherein the first multiband termination device comprises a fourth transmission line section connected on one end to an input of the first multiband termination device.

8. The amplifier device according to claim 1, wherein the first multiband termination device comprises three serially connected transmission line sections of consecutively different impedances.

9. The amplifier device according to claim 1, wherein the first multiband termination device comprises two serially connected transmission line sections of different impedances, wherein a first one of the two serially connected transmission line sections is connected to an input of the first multiband termination device and a third transmission line section connected on one end to the input of the first multiband termination device.

10. The amplifier device according to claim 1, wherein the first multiband termination device comprises at least two serially connected transmission line sections, and at least one resonator connected between a respective intermediate point and ground, each intermediate point being located between two consecutive transmission line sections.

11. The amplifier device according to claim 1, wherein the first multiband termination device comprises at least two serially connected transmission line sections, and at least one resonator, connected serially between two consecutive transmission line sections.

12. The amplifier device according to claim 5, wherein at least one of the transmission line sections is terminated in an open circuit.

13. The amplifier device according to claim 5, wherein at least one of the transmission line sections is terminated in a short circuit.

14. The amplifier device according to claim 1, wherein the first multiband termination device is arranged to reflect signals with a predetermined reflection phase in at least three frequency bands.

15. The amplifier device according to claim 1, wherein the first multiband termination device comprises distributed elements.

16. The amplifier device according to claim 1, wherein the first multiband termination device comprises lumped elements.

17. The amplifier device according to claim 1, wherein the first directional coupler device comprises at least three parallel connected directional couplers.

18. The amplifier device according to claim 1, further comprising
 a tertiary amplifier arranged to receive at least part of the input signal;
 a second directional coupler of which one input is connected to an output of the tertiary amplifier and a second input is connected to the output of the secondary amplifier; and
 a second multiband termination device arranged to reflect signals in at least two frequency bands;
 wherein one output of the second directional coupler is connected to the second multiband termination device and another output of the second directional coupler is connected to one input of the first directional coupler device.

19. The amplifier device according to claim 2, further comprising a second splitter arranged between the input signal and the first splitter, wherein the input signal is an input to the second splitter, one output of the second splitter is connected to a tertiary amplifier and another output of the second splitter is connected to an input of the first splitter.

20. The amplifier device according to claim 18, wherein the tertiary amplifier is configured to be activated when the power of the input signal exceeds a second threshold value.

21. The amplifier device according to claim 1, wherein at least one of the amplifiers is a wideband amplifier operable in a continuous frequency band covering the at least two frequency bands reflected with the predetermined reflection phase by the first multiband termination device.

22. The amplifier device according to claim 1, wherein at least one of the amplifiers is a multiband amplifier operable in discrete frequency bands, the discrete frequency bands at least corresponding to the at least two frequency bands reflected with the predetermined reflection phase by the first multiband termination device.

23. A radio base station comprising the amplifier device according to claim 1.

24. A mobile communication terminal comprising the amplifier device according to claim 1.

* * * * *